(12) United States Patent
Chang et al.

(10) Patent No.: US 9,859,249 B2
(45) Date of Patent: Jan. 2, 2018

(54) METHOD OF FABRICATING AN ELECTRONIC PACKAGE

(71) Applicant: Intel Corporation, Santa Clara, CA (US)

(72) Inventors: Peter Chang, Portland, OR (US); Michael Mayberry, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 14/778,111

(22) PCT Filed: Dec. 3, 2014

(86) PCT No.: PCT/US2014/068264
§ 371 (c)(1),
(2) Date: Sep. 18, 2015

(87) PCT Pub. No.: WO2016/089382
PCT Pub. Date: Jun. 9, 2016

(65) Prior Publication Data
US 2016/0358885 A1    Dec. 8, 2016

(51) Int. Cl.
*H01L 21/00* (2006.01)
*H01L 23/00* (2006.01)
(Continued)

(52) U.S. Cl.
CPC ............. *H01L 24/94* (2013.01); *H01L 23/48* (2013.01); *H01L 23/58* (2013.01); *H01L 24/81* (2013.01);
(Continued)

(58) Field of Classification Search
CPC ......... H01L 21/56; H01L 21/60; H01L 24/81; H01L 25/50; H01L 23/58; H01L 23/48; H01L 24/94
See application file for complete search history.

(56) References Cited

U.S. PATENT DOCUMENTS

| 2011/0003410 A1 | 1/2011 | Tsay et al. |
| 2011/0151602 A1 | 6/2011 | Speier |

(Continued)

FOREIGN PATENT DOCUMENTS

| CN | 105849902 A | 8/2016 |
| KR | 1020070112277 A | 11/2007 |

(Continued)

OTHER PUBLICATIONS

"International Application Serial No. PCT/US2014/068264, International Search Report dated Aug. 28, 2015", 3 pgs.

(Continued)

*Primary Examiner* — Richard Booth
(74) *Attorney, Agent, or Firm* — Schwegman Lundberg & Woessner, P.A.

(57) ABSTRACT

Some example forms relate a method of fabricating an electronic package. The method includes attaching a source wafer that includes micro devices to a target wafer. The method further includes removing a portion of the source wafer from the target wafer to form an electronic package. The micro devices remain on the target wafer when the source wafer is removed from target wafer. The method may further include performing post processing on the electronic package that is formed after the source wafer is removed from the target wafer. In some forms of the method, some of the micro devices remain on the source wafer when the source wafer is removed from target wafer.

17 Claims, 7 Drawing Sheets

(51) Int. Cl.
  *H01L 23/48* (2006.01)
  *H01L 23/58* (2006.01)
  *H01L 25/00* (2006.01)

(52) U.S. Cl.
  CPC ...... *H01L 25/50* (2013.01); *H01L 2224/0401* (2013.01); *H01L 2224/13109* (2013.01); *H01L 2224/13144* (2013.01); *H01L 2224/81005* (2013.01); *H01L 2224/94* (2013.01); *H01L 2225/06513* (2013.01)

(56) References Cited

U.S. PATENT DOCUMENTS

| | | | |
|---|---|---|---|
| 2013/0273691 A1 | 10/2013 | Pascual et al. | |
| 2013/0295721 A1 | 11/2013 | Lyu | |
| 2014/0159065 A1 | 6/2014 | Hu et al. | |

FOREIGN PATENT DOCUMENTS

| | | |
|---|---|---|
| TW | 201622022 A | 6/2016 |
| WO | WO-2016089382 A1 | 6/2016 |

OTHER PUBLICATIONS

"International Application Serial No. PCT/US2014/068264, Written Opinion dated Aug. 28, 2015", 6 pgs.

"Japanese Application Serial No. 2016-562450, Office Action dated Jan. 24, 2017", W/English Translation, 12 pgs.

"Korean Application Serial No. 2015-7031502, Office Action dated Oct. 13, 2016", 13 pgs.

"Korean Application Serial No. 2015-7031502, Response filed Dec. 12, 2016 to Office Action dated Oct. 13, 2016".

"Taiwanese Application Serial No. 104133398, Office Action dated Jul. 27, 2016", 8 pgs.

METHOD OF FABRICATING AN ELECTRONIC PACKAGE

This application is a U.S. National Stage Application under 35 U.S.C. 371 from International Application No. PCT/US2014/068264, filed Dec. 3, 2014, which is hereby incorporated by reference in its entirety.

TECHNICAL FIELD

Embodiments described herein generally relate to a method fabricating an electronic package, and more particularly to a method fabricating an electronic package by attaching a source wafer to a target wafer.

BACKGROUND

There are typically various difficulties that are associated with integrating micro devices into electronic packages. These difficulties include die isolation, handling and bonding as well as forming interconnects in electronic assemblies that include micro devices.

Traditional pick and place methods are usually able to handle devices down to approximately 250 microns in XY size and 50 microns in thickness (i.e., Z height). However, this relatively large thickness is one of reasons that it can be difficult to form interconnects in electronic assemblies that include micro devices.

There are two common transfer methods that are used to integrate micro dice as small as 10 microns in the XY orientation and 5 microns in the Z direction. One method utilizes sophisticated MEMS print head technology while another method is limited to room temperature bonding with an elastoviscous stamp.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The example methods described herein may be able to integrate micro devices (i.e., micro devices less than 10 microns in XY orientation and less than 5 microns in Z height) with direct bonding between the micro devices without intermediate steps like dicing, pickup, and pickup head or stamps. The method may also be able to embed a micro device on another die or substrate with a variety of conventional materials, processes and tools.

A source wafer may be fabricated by undercutting prefabricated micro devices their substrate with anchoring structures between the micro devices. In some forms, dielectric pedestals or mechanical stops may be formed on the prefabricated target wafers.

As part of the method described herein, the source wafer may be flipped upside-down and bonded to the target wafer through bonding to the dielectric pedestal or solder bonding controlled by the mechanical stops. Once the source wafer is bonded to the target wafer, the source wafer may be pulled away from the target wafer such that the micro devices are released from the anchoring structures on the source wafer. Since the micro devices are very thin, interconnects or through silicon vias may be formed with wafer level processing to complete the integration of the source wafer and the micro device to form an electronic package.

Figure 1A:
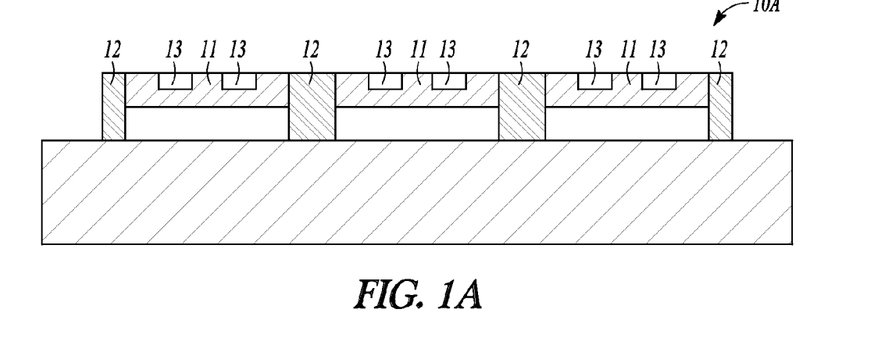
FIG. 1A shows an example source wafer.
Figure 1B:
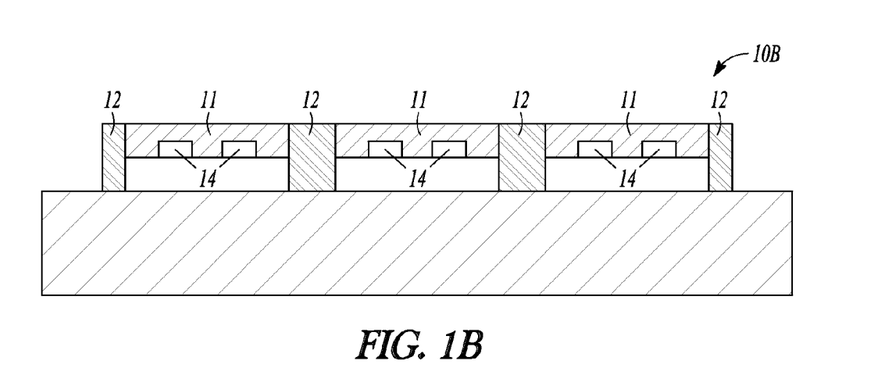
FIG. 1B shows another example source wafer.

FIGS. 1A and 1B show two different example types of source wafers 10A, 10B. The source wafer 10A in FIG. 1A includes micro devices 11 connected between anchors 12 with conductive pads 13 on a top side of the micro devices 11. The source wafer 10B in FIG. 1B includes micro devices 11 connected between anchors 12 with conductive pads 14 on a bottom side of the micro devices 11. These two different types of source wafers 10A, 10B may be bonded directly to a target wafer as described below. The source wafers 10A, 10B may be fabricated using any techniques that are known now or discovered in the future.

Figure 2A:
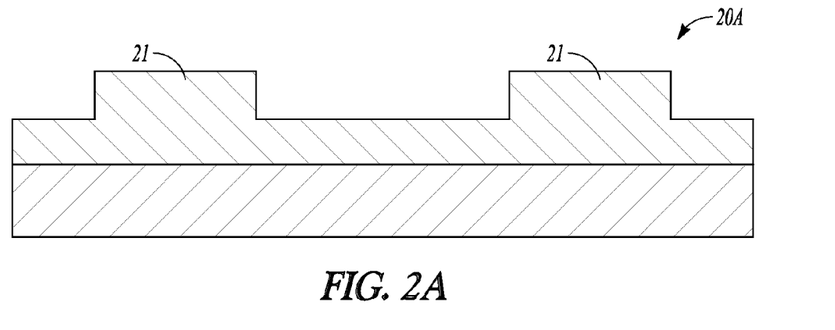
FIG. 2A shows an example target wafer.
Figure 2B:
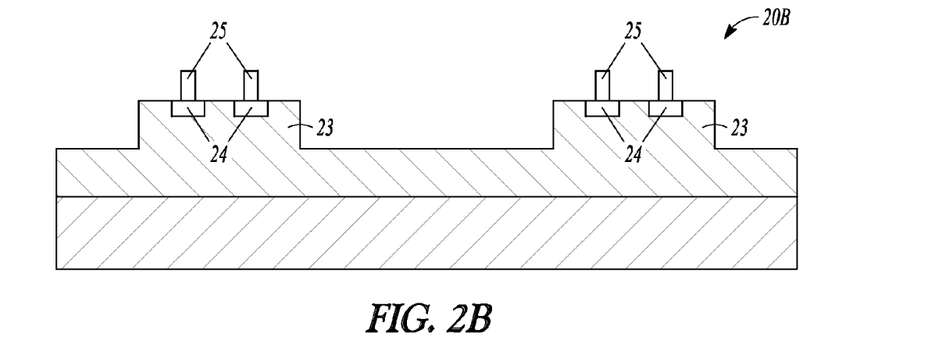
FIG. 2B shows another example target wafer.
Figure 2C:
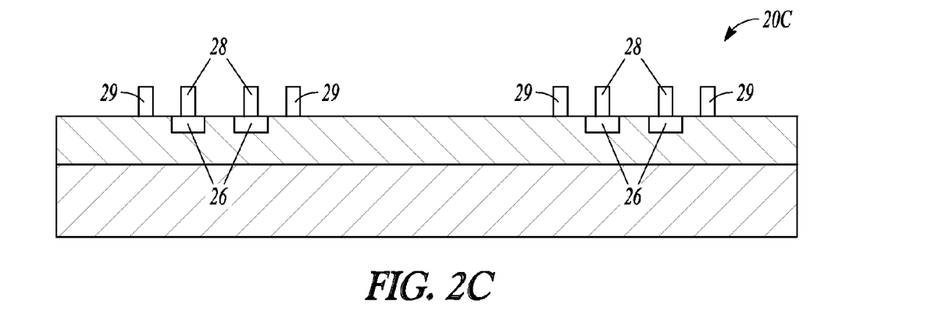
FIG. 2C shows still another example target wafer.

FIGS. 2A, 2B, and 2C show three different example configurations for target wafers. FIG. 2A illustrates a target wafer 20A that includes a dielectric pedestals 21 on an upper surface of the target wafer 20A.

FIG. 2B illustrates a target wafer 20B that includes dielectric pedestals 23. The target wafer 20B further includes conductive pads 24 and solder bumps 25 on the dielectric pedestals 23.

FIG. 2C illustrates a target wafer 20C that includes conductive pads 26 on a surface of the target wafer 20C. The target wafer 20C further includes solder bumps 28 on the conductive pads 26 and stops 29 on the surface of the target wafer 20C.

Figure 4:
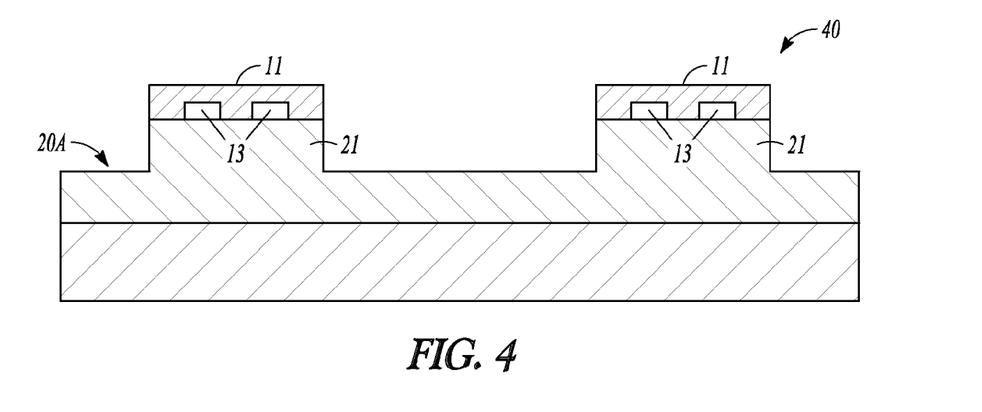
FIG. 4 shows the example package of FIG. 3 with a portion of the source wafer removed.
Figure 6:
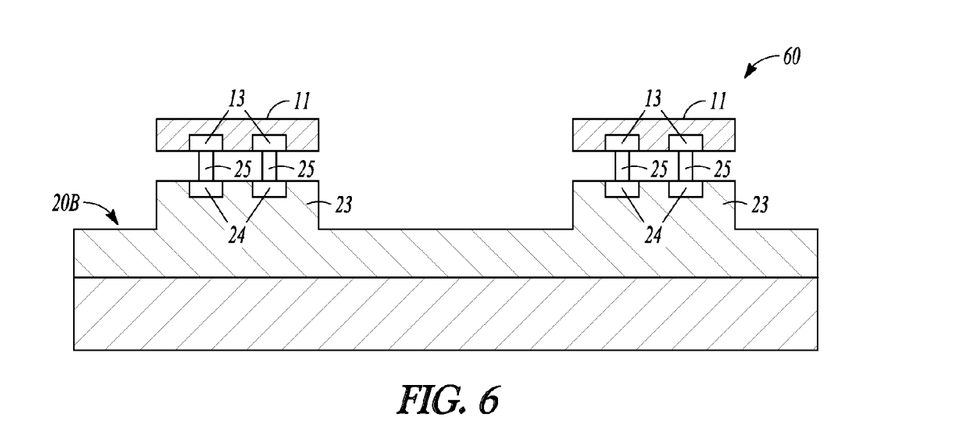
FIG. 6 shows the example package of FIG. 5 with a portion of the source wafer removed.
Figure 8:
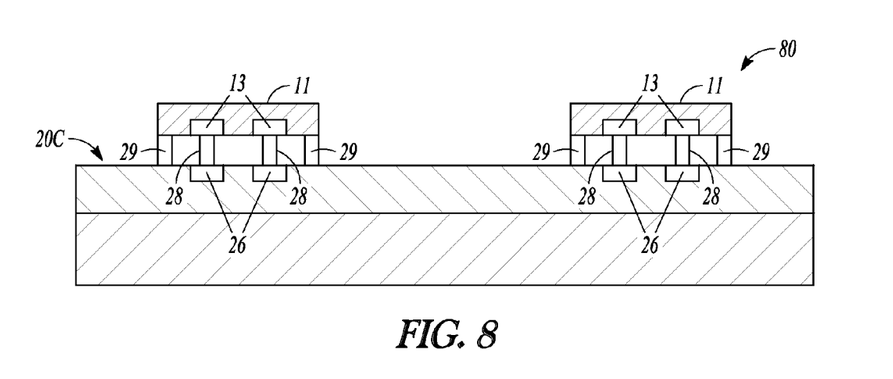
FIG. 8 shows the example package of FIG. 7 with a portion of the source wafer removed.
Figure 10:
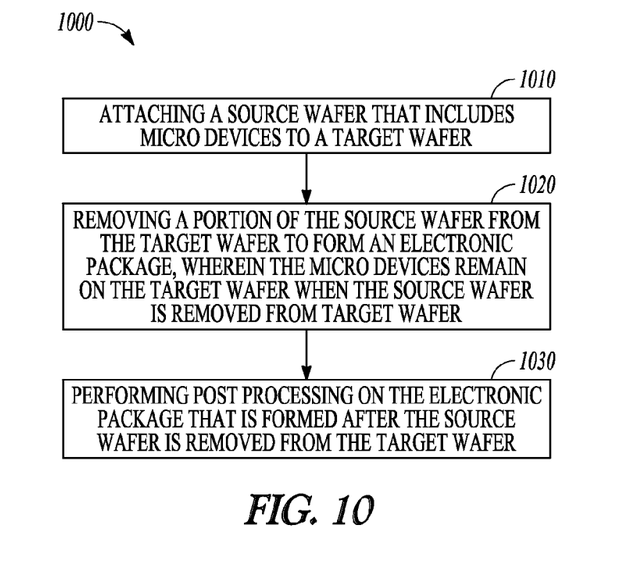
FIG. 10 is a flow diagram of a method of fabricating an electronic package.

FIG. 10 is a flow diagram of a method [1000] of fabricating an electronic package (see, e.g., electronic packages 40, 60, 80 in FIGS. 4, 6, 8). The method [1000] includes [1010] attaching a source wafer 10A or 10B that includes micro devices 11 to a target wafer 20A or 20B or 20C. It should be noted that although the illustrated FIGS. show source wafer 10A of FIG. 1 as being used to form electronic packages 40, 60, 80, the source wafer 10B may alternatively be used to form electronic packages 40, 60, 80 (among other types of source wafers that are known now or discovered in the future).

As an example, the source wafer 10A or 10B that includes micro devices 11 may be bonded to a target wafer 20A or 20B or 20C using adhesives at room temperature. The manner in which the source wafer 10A or 10B may be bonded to a target wafer 20A or 20B or 20C will depend in part on the configuration of the source wafer 10A or 10B and the target wafer 20A or 20B or 20C, as well as the desired functionality and/or configuration of the electronic packages 40, 60, 80.

The method [1000] further includes [1020] removing a portion of the source wafer 10A or 10B from the target wafer to form an electronic package (see, e.g., FIGS. 4, 6, 8 where the portion of the source wafer 10A is removed). The micro devices 11 remain on the target wafer 20A or 20B or 20C when the source wafer 10A or 10B is removed from target wafer 20A or 20B or 20C.

Figure 3:
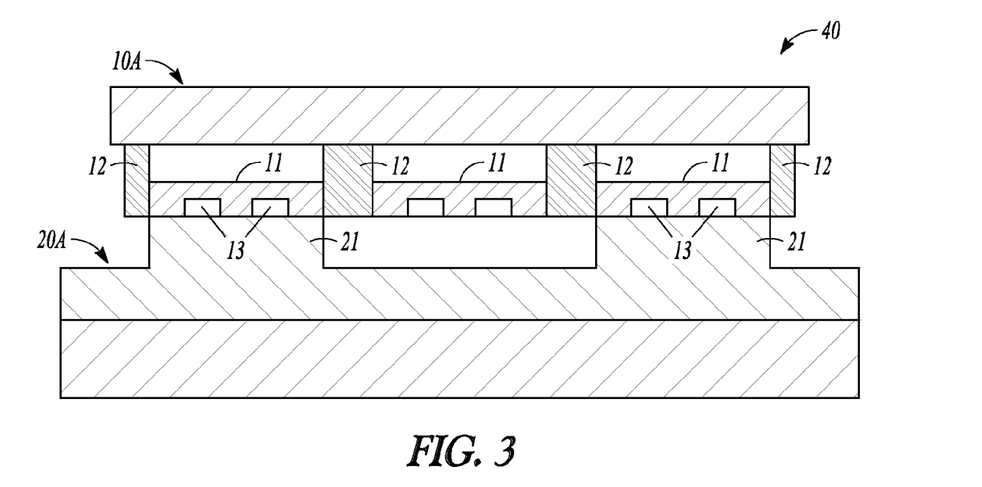
FIG. 3 shows an example package formed by attaching the source wafer of FIG. 1A to the target wafer of FIG. 2A.

FIG. 3 shows the example package 40 formed by attaching the source wafer 10A of FIG. 1A to the target wafer 20A of FIG. 2A. FIG. 4 shows the example package 40 of FIG. 3 with a portion of the source wafer 10A removed.

Figure 5:
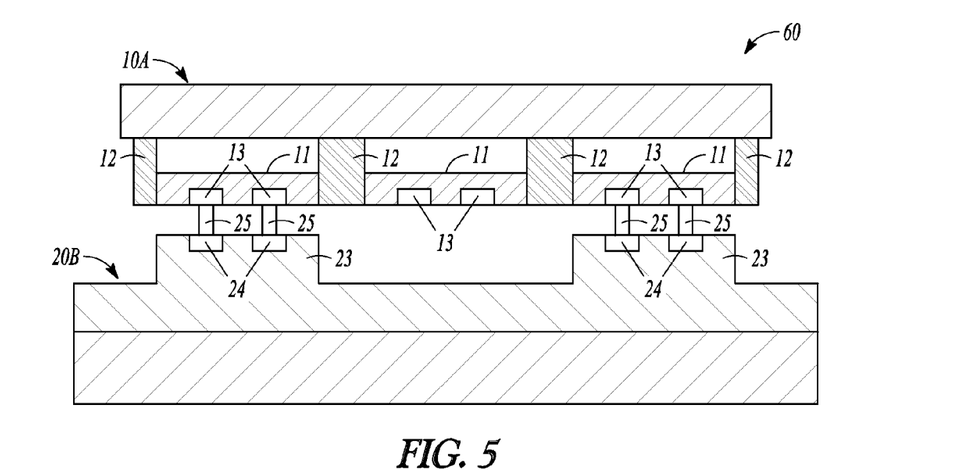
FIG. 5 shows an example package formed by attaching the source wafer of FIG. 1A to the target wafer of FIG. 2B.

FIG. 5 shows an example package 60 formed by attaching the source wafer 10A of FIG. 1A to the target wafer 20B of FIG. 2B. FIG. 6 shows the example package 60 of FIG. 5 with a portion of the source wafer 10A removed.

Figure 7:
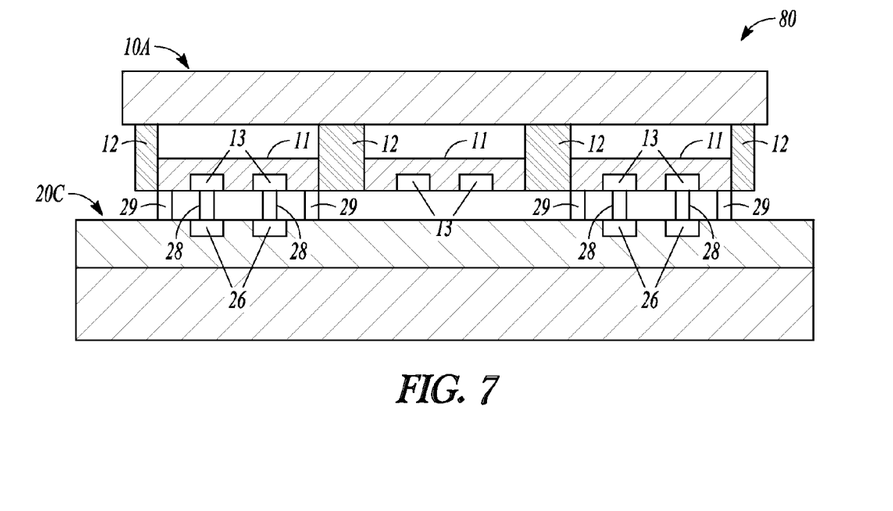
FIG. 7 shows an example package formed by attaching the source wafer of FIG. 1A to the target wafer of FIG. 2C.

FIG. 7 shows an example package 80 formed by attaching the source wafer 10A of FIG. 1A to the target wafer 20C of FIG. 2C. FIG. 8 shows the example package 80 of FIG. 7 with a portion of the source wafer 20C removed.

As shown in FIG. 3, in some forms of the method [1000], [1010] attaching a source wafer 10A that includes micro devices 11 to a target wafer 20A may include (i) attaching the micro devices 11 to respective dielectric pedestals 21 that extend from a surface of the target wafer 20A.

As shown in FIG. 5, in some forms of the method [1000], [1010] attaching a source wafer 10A that includes micro devices 11 to a target wafer 20B may include attaching the micro devices 11 to solder bumps 25 that extend from a surface of the target wafer 20B. In addition, the solder bumps 25 may be attached to conductive pads 24 on a surface of the target wafer 20B.

As shown in FIG. 7, in some forms of the method [1000], [1010] attaching a source wafer 10A that includes micro devices 11 to a target wafer 20C may include attaching conductive pads 13 on the micro devices 11 with conductive pads 26 on the target wafer 20C. In addition, [1010] attaching a source wafer 10A that includes micro devices 11 to a target wafer 20C may include attaching the micro devices 11 to solder bumps 28 that extend from a surface of the target wafer 20C and engaging (e.g., adhering) the micro devices 11 with stops 29 that extend from a surface of the target wafer 20C.

As an example, the solder bumps 28 may be approximately 5 microns in thickness and 5 microns in height with the stops 29 providing gap height control, especially when using conventional thermal compression bonding tools. In addition, the solder bump 28 height may be further reduced when InAu or AuSn solders are used.

Figure 9:
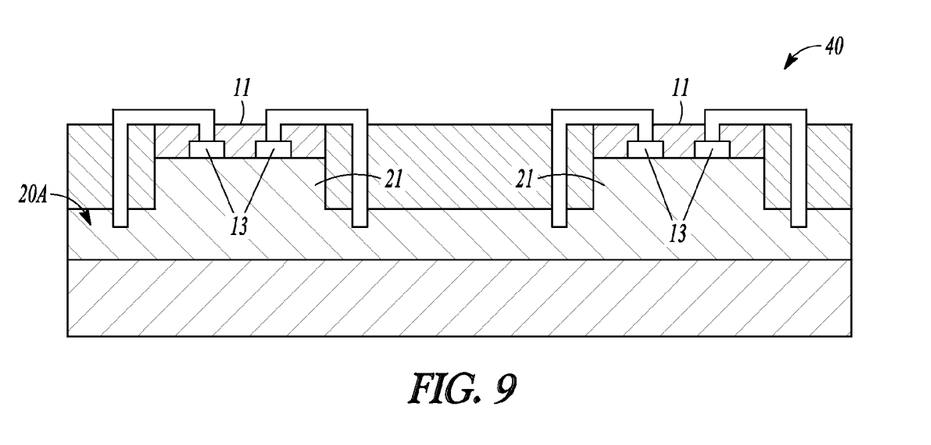
FIG. 9 shows the electronic package of FIG. 4 where the electronic package has been subjected to example post source wafer removal processing.

The method [1000] may further include [1130] performing post processing on the electronic package 40, 60, 80 that is formed after the source wafer 10A or 10B is removed from the target wafer 20A or 20B or 20C. FIG. 9 shows the electronic package 40 of FIG. 4 where the electronic package 40 has been subjected to example post source wafer 10A removal processing. The type of post source wafer 10A removal processing that is done to further fabricate the electronic packages 40, 60, 80 will depend in part on the desired final configuration and functionality for the electronic packages 40, 60, 80 (among other factors including, but not limited to, cost, yield, manufacturability and materials).

In some forms of the method [1000], some of the micro devices 11 remain on the source wafer 10A or 10B when the source wafer 10A or 10B is removed from target wafer 20A or 20B or 20C. As shown in FIGS. 4, 6 and 8, only two of the three micro devices 11 remain on the target wafers 20A, 20B, 20C. The number of micro devices 11 that remain on the source wafer 10A or 10B will depend on the relative alignment and size of the source wafers 10A, 10B and target wafers 20A, 20B, 20C. It is contemplated that the micro devices 11 on the removed portion of the source wafer 10A or 10B may then be applied to another target wafer or another target wafer area.

In other forms of the method [1000], the target wafers 20A, 20B, 20C may include connecting sections (see, e.g., dielectric pedestal 21 and die 22 in FIG. 4) that are part of the target wafers 20A, 20B, 20C such that attaching the source wafers 10A, 10B that includes micro devices 11 to the target wafers 20A, 20B, 20C may include attaching each of connecting sections to the source wafers 10A, 10B.

However, in some forms, not all of the connecting sections may be attached to the source wafers 10A, 10B. As an example, the source wafer 10A or 10B may be smaller than target wafer 20A or 20B or 20C such that some connecting sections on the target wafer 20A or 20B or 20C do not receive micro devices 11, or multiple source wafers may be required in order to utilize all of the connecting sections on the target wafer.

The methods described herein may reduce or eliminate the dicing and handling that is required when utilizing micro devices, especially when compared to conventional pick and place techniques that are associated with micro devices. In addition, the micro device size may be made much smaller with tighter integration of associated on-die interconnects. This reduced die size and tighter integration of interconnects may lower power consumption because there are little or no IO drivers and reduced parasitics.

The methods described herein may also reduce the need to fabricate stamps or develop new tools, especially when compared to existing micro-transfer printing techniques. The electronic assemblies and methods may be simple and applicable to many SoC, photon ICs, sensors, IoT, and Wearable products. Some examples include, but are not limited to, GaN transistor on SoC, small size flash memory on advanced logic IC, an IA core on a sensor, or lasers on a photonic IC.

Figure 11:
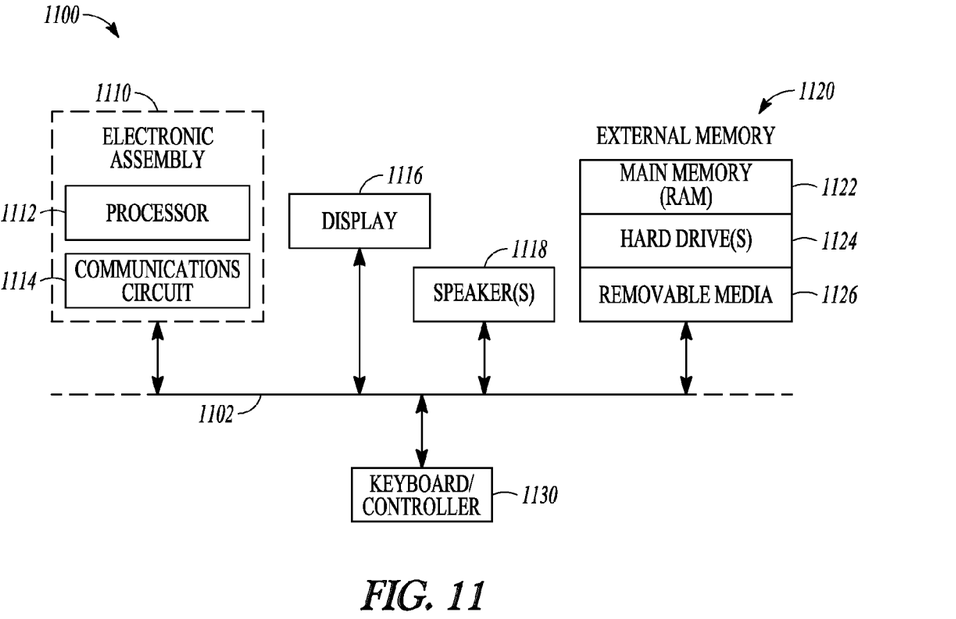
FIG. 11 is a block diagram of an electronic apparatus incorporating at least one of the methods described herein.

FIG. 11 is a block diagram of an electronic apparatus 1100 incorporating at least one of the methods [1000] described herein. Electronic apparatus 1100 is merely one example of an electronic apparatus in which forms of the methods [1000] described herein may be used. Examples of an electronic apparatus 1100 include, but are not limited to, personal computers, tablet computers, mobile telephones, game devices, MP3 or other digital music players, etc. In this example, electronic apparatus 1100 comprises a data processing system that includes a system bus 1102 to couple the various components of the electronic apparatus 1100. System bus 1102 provides communications links among the various components of the electronic apparatus 1200 and may be implemented as a single bus, as a combination of busses, or in any other suitable manner.

An electronic assembly 1110 as describe herein may be coupled to system bus 1102. The electronic assembly 1110 may include any circuit or combination of circuits. In one embodiment, the electronic assembly 1110 includes a processor 1112 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 1110 are a custom circuit, an application-specific integrated circuit (ASIC), or the like, such as, for example, one or more circuits (such as a communications circuit 1114) for use in wireless devices like mobile telephones, tablet computers, laptop computers, two-way radios, and similar electronic systems. The IC can perform any other type of function.

The electronic apparatus 1100 may also include an external memory 1120, which in turn may include one or more memory elements suitable to the particular application, such as a main memory 1122 in the form of random access memory (RAM), one or more hard drives 1124, and/or one or more drives that handle removable media 1126 such as compact disks (CD), flash memory cards, digital video disk (DVD), and the like.

The electronic apparatus 1100 may also include a display device 1116, one or more speakers 1118, and a keyboard and/or controller 1130, which can include a mouse, trackball, touch screen, voice-recognition device, or any other device that permits a system user to input information into and receive information from the electronic apparatus 1100.

In some forms, the electronic apparatus 1100 may include any of the micro devices described herein within a computing system where the computing system is affixed to at least a portion of any of target wafers described herein. In some forms, at least a portion of any of the source wafers described herein may also be affixed to the micro device(s). Other forms may also any of the micro devices described herein in a computing system wherein the micro device is affixed to at least a portion of any of the target wafers described herein.

To better illustrate the methods disclosed herein, a non-limiting list of embodiments is provided here:

Example 1 includes a method that includes attaching a source wafer that includes micro devices to a target wafer and removing a portion of the source wafer from the target wafer to form an electronic package. The micro devices remain on the target wafer when the source wafer is removed from target wafer.

Example 2 includes the method of example 1, wherein attaching a source wafer that includes micro devices to a target wafer includes attaching the micro devices to respective dielectric pedestals that extend from a surface of the target wafer.

Example 3 includes the method of any one of examples 1-2, wherein attaching a source wafer that includes micro devices to a target wafer includes attaching the micro devices to solder bumps that extend from a surface of the target wafer.

Example 4 includes the method of any one of examples 1-3, wherein attaching a source wafer that includes micro devices to a target wafer includes engaging the micro devices with stops that extend from a surface of the target wafer.

Example 5 includes the method of example 4, wherein engaging the micro devices with stops that extend from a surface of the target wafer includes adhering the micro devices to the stops.

Example 6 includes the method of any one of examples 1-5, wherein attaching a source wafer that includes micro devices to a target wafer includes attaching the micro devices to solder bumps that extend from a surface of the target wafer and engaging the micro devices with stops that extend from a surface of the target wafer.

Example 7 includes the method of any one of examples 1-6, wherein attaching a source wafer that includes micro devices to a target wafer includes attaching the micro devices to respective dies that are on a surface of the target wafer.

Example 8 includes the method of any one of examples 1-7, wherein attaching a source wafer that includes micro devices to a target wafer includes attaching conductive pads on the micro devices with the target wafer.

Example 9 includes the method of any one of examples 1-8, wherein attaching a source wafer that includes micro devices to a target wafer includes attaching the source wafer to conductive pads on the target wafer.

Example 10 includes the method of any one of examples 1-9, wherein attaching a source wafer that includes micro devices to a target wafer includes attaching conductive pads on the micro devices with conductive pads on the source wafer.

Example 11 includes the method of any one of examples 1-10, wherein attaching a source wafer that includes micro devices to a target wafer includes attaching conductive pads on the micro devices with solder bumps that are mounted on conductive pads on the target wafer.

Example 12 includes the method of any one of examples 1-11, and further including performing post processing on the electronic package that is formed after the source wafer is removed from the target wafer.

Example 13 includes the method of any one of examples 1-12, wherein some of the micro devices remain on the source wafer when the source wafer is removed from target wafer.

Example 14 includes the method of example 13, wherein the target wafer includes connecting sections that are part of the target wafer, wherein attaching the source wafer that includes micro devices to the target wafer includes attaching each of connecting sections to the target wafer.

Example 15 includes a method that includes attaching a source wafer that includes micro devices to a target wafer. The micro devices include conductive pads and the target wafer includes a dielectric pedestal on a surface of the target wafer. The method further includes removing a portion of the source wafer from the target wafer to form an electronic package. The conductive pads on the micro devices engage the die on the target wafer when the source wafer is removed from target wafer.

Example 16 includes the method of example 15, wherein the target wafer includes dielectric pedestals such that the conductive pads on some of micro devices engage the dielectric pedestals on the target wafer when the source wafer is removed from target wafer.

Example 17 includes the method of any one of examples 15-16, wherein some of the micro devices remain on the source wafer when the source wafer is removed from target wafer.

Example 18 includes a method that includes attaching a source wafer that includes micro devices to conductive pads on surface of a target wafer. Attaching the source wafer may include engaging the micro devices with stops that extend from a surface of the target wafer and attaching the micro devices to solder bumps that extend from the conductive pads on the target wafer. The method further includes removing a portion of the source wafer from the source wafer to form an electronic package. The micro devices are attached to the solder bumps when the source wafer is removed from target wafer.

Example 19 includes the method of example 18, wherein attaching the source wafer includes attaching conductive pads on the micro device with the solder bumps on the target wafer.

Example 20 includes the method of any one of examples 18-19, wherein some of the micro devices remain on the source wafer when the source wafer is removed from target wafer.

Example 21 includes a micro device within a computing system where the computing system is affixed to at least a portion of any a target wafer.

Example 22 includes the micro device within a computing system of example 18, wherein at least a portion of a source wafer may also be affixed to the micro device.

Example 23 includes a micro device within a computing system where the micro device is affixed to at least a portion of a target wafer.

These and other examples and features of the present methods and computing systems are set forth in part in the detailed description.

This overview is intended to provide non-limiting examples of the present subject matter. It is not intended to provide an exclusive or exhaustive explanation. The detailed description is included to provide further information about the methods described herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A method comprising:
   attaching a source wafer that includes micro devices to a target wafer; and
   removing a portion of the source wafer from the target wafer to form an electronic package, wherein the micro devices remain on the target wafer when the source wafer is removed from target wafer, wherein attaching a source wafer that includes micro devices to a target wafer includes attaching the micro devices to respective dielectric pedestals that extend from a surface of the target wafer, wherein attaching a source wafer that includes micro devices to a target wafer includes attaching the micro devices to solder bumps that extend from a surface of the target wafer and engaging the micro devices with stops that extend from a surface of the target wafer.

2. A method comprising:
   attaching a source wafer that includes micro devices to a target wafer; and
   removing a portion of the source wafer from the target wafer to form an electronic package, wherein the micro devices remain on the target wafer when the source wafer is removed from target wafer, wherein attaching a source wafer that includes micro devices to a target wafer includes engaging the micro devices with stops that extend from a surface of the target wafer.

3. The method of claim 2, wherein engaging the micro devices with stops that extend from a surface of the target wafer includes adhering the micro devices to the stops.

4. A method comprising:
   attaching a source wafer that includes micro devices to a target wafer; and
   removing a portion of the source wafer from the target wafer to form an electronic package, wherein the micro devices remain on the target wafer when the source wafer is removed from target wafer, wherein attaching a source wafer that includes micro devices to a target wafer includes attaching the micro devices to respective dies that are on a surface of the target wafer.

5. The method of claim 4, wherein attaching a source wafer that includes micro devices to a target wafer includes attaching conductive pads on the micro devices with the target wafer.

6. The method of claim 4, wherein attaching a source wafer that includes micro devices to a target wafer includes attaching the source wafer to conductive pads on the target wafer.

7. The method of claim 4, wherein attaching a source wafer that includes micro devices to a target wafer includes attaching conductive pads on the micro devices with conductive pads on the source wafer.

8. The method of claim 1, wherein attaching a source wafer that includes micro devices to a target wafer includes attaching conductive pads on the micro devices with solder bumps that are mounted on conductive pads on the target wafer.

9. The method of claim 1, further comprising performing post processing on the electronic package that is formed after the source wafer is removed from the target wafer.

10. The method of claim 1, wherein some of the micro devices remain on the source wafer when the source wafer is removed from target wafer.

11. The method of claim 10, wherein the target wafer includes connecting sections that are part of the target wafer, wherein attaching the source wafer that includes micro devices to the target wafer includes attaching each of connecting sections to the target wafer.

12. A method comprising:
attaching a source wafer that includes micro devices to a target wafer, wherein the micro devices include conductive pads and the target wafer includes a dielectric pedestal on a surface of the target wafer; and
removing a portion of the source wafer from the target wafer to form an electronic package, wherein the conductive pads on micro devices engage the die on the target wafer when the source wafer is removed from target wafer.

13. The method of claim 12, wherein the target wafer includes dielectric pedestals such that the conductive pads on some of micro devices engage the dielectric pedestals on the target wafer when the source wafer is removed from target wafer.

14. The method of claim 12, wherein some of the micro devices remain on the source wafer when the source wafer is removed from target wafer.

15. A method comprising:
attaching a source wafer that includes micro devices to conductive pads on surface of a target wafer, wherein attaching the source wafer includes engaging the micro devices with stops that extend from a surface of the target wafer and attaching the micro devices to solder bumps that extend from the conductive pads on the target wafer; and
removing a portion of the source wafer from the source wafer to form an electronic package, wherein the micro devices are attached to the solder bumps when the source wafer is removed from target wafer.

16. The method of claim 15, wherein attaching the source wafer includes attaching conductive pads on the micro device with the solder bumps on the target wafer.

17. The method of claim 15, wherein some of the micro devices remain on the source wafer when the source wafer is removed from target wafer.

* * * * *